(12) United States Patent
Tsai

(10) Patent No.: US 7,291,037 B2
(45) Date of Patent: Nov. 6, 2007

(54) FLEXIBLE CIRCUIT BOARD

(75) Inventor: Ching-Cheng Tsai, Taipei (TW)

(73) Assignee: Chicony Electronics Co. Ltd, Taipei Hsien (TW)

( * ) Notice: Subject to any disclaimer, the term of this patent is extended or adjusted under 35 U.S.C. 154(b) by 0 days.

(21) Appl. No.: 11/476,849

(22) Filed: Jun. 29, 2006

(65) Prior Publication Data

US 2007/0099483 A1    May 3, 2007

(30) Foreign Application Priority Data

Oct. 28, 2005    (TW) ............................... 94218672 U

(51) Int. Cl.
*H01R 12/24* (2006.01)

(52) U.S. Cl. .................... 439/492; 439/59; 439/951; 174/254

(58) Field of Classification Search ................ 439/492, 439/67, 65, 493, 59–60, 951; 174/254, 117 F, 174/117 FF See application file for complete search history.

(56) References Cited

U.S. PATENT DOCUMENTS

| | | | | | |
|---|---|---|---|---|---|
| 2,961,629 | A | * | 11/1960 | Kamm | 439/61 |
| 3,723,635 | A | * | 3/1973 | Smith | 174/254 |
| 3,876,964 | A | * | 4/1975 | Balaster et al. | 333/238 |
| 5,037,315 | A | * | 8/1991 | Collier et al. | 439/83 |
| 5,205,738 | A | * | 4/1993 | Anderson et al. | 439/59 |
| 5,590,465 | A | * | 1/1997 | Santo | 29/884 |
| 6,454,573 | B2 | * | 9/2002 | Hayashi et al. | 439/67 |
| 2005/0048810 | A1 | * | 3/2005 | Howie et al. | 439/67 |
| 2006/0042816 | A1 | * | 3/2006 | Sakurai et al. | 174/88 R |

* cited by examiner

*Primary Examiner*—Michael C. Zarroli
(74) *Attorney, Agent, or Firm*—Bacon & Thomas PLLC

(57) ABSTRACT

A flexible circuit board is provided, comprising a flexible substrate having an upper surface and a lower surface and a plurality of electrically conductive pads overlaid on an upper surface of the flexible substrate. Front ends of the electrically conductive pads do not reach a front edge of the flexible substrate and are separated from the front edge of the flexible substrate by a distance.

8 Claims, 5 Drawing Sheets

FLEXIBLE CIRCUIT BOARD

BACKGROUND OF THE INVENTION

1. Field of the Invention

The present invention relates to a flexible circuit board, especially to a flexible circuit board being able to avoid scratching of overlay objects on a flexible substrate.

2. Description of the Related Art

Owing to the coming of digital times, the dependency of people on the electronic products increases. To meet demands of current electronic products such as high speed, high performance and lightweight, flexible circuit boards have gradually been applied in various electronic products, such as notebook computer, mobile phone, digital camera, personal digital assistant, printer and CD-ROM, etc.

The flexible circuit board may be a FPC (Flexible Printed Circuit), a FFC (Flexible Flat Cable) or a thin film switch, which is not only used for electrical connection, but also for carrying chips or other electronic devices. For enabling the cooperation and communication between the chips and other electronic devices, as well as effectively protecting the fragile chips, various package technologies for chips are developed. For example, common wafer bonding technologies include wire bonding, flip-chip and tape automated bonding (TAB), etc. The tape automated bonding is used to bond a chip on a flexible circuit board. Since the flexible circuit board itself is bendable, making the subsequent assembly processes more flexible, and the application becomes more widespread.

FIG. 6 and FIG. 7 schematically illustrate a conventional flexible circuit board being inserted into a connector terminal and a conventional flexible circuit board inserted into a connector terminal. The conventional flexible circuit board comprises a flexible substrate 51 and electrically conductive pads 52 overlaid on an upper surface of the flexible substrate 51. Front ends 54 of the electrically conductive pads 52 are aligned with a front edge 53 of the flexible substrate 51. When an operator pushes the conventional flexible circuit board into a connector terminal 30 for assembly, an upper elastic flat piece 31 and a lower elastic flat piece 32 of the connector terminal 30 will be opened by the conventional flexible circuit board and electrically connect the conventional flexible circuit board. However, during the connecting process of the upper elastic flat piece 31, the lower elastic flat piece 32 and the conventional flexible circuit board, the bent inclined surface of the upper elastic flat piece 31 may scratch (or abrade) the front ends 54 of the electrically conductive pads 52, or even the electrically conductive pads 52 may depart (or be removed) from the conventional flexible circuit board, resulting in that the conventional flexible circuit board cannot electrically connect the connector terminal 30. Thus the conventional flexible circuit board still has disadvantages and need to be improved.

SUMMARY OF THE INVENTION

It is a primary objective of the present invention to provide a flexible circuit board with a plurality of electrically conductive pads overlaid on a flexible substrate, in which front ends of the electrically conductive pads do not reach a front edge of the flexible substrate and are separated from a front edge of the flexible substrate by a distance, thus when an operator pushes the flexible circuit board into a connector terminal for assembly, the connector terminal may not scratch (or abrade) the electrically conductive pads.

For achieving the above objective, the present invention provides a flexible circuit board comprising a flexible substrate having an upper surface and a lower surface and a plurality of electrically conductive pads overlaid on the upper surface of the flexible substrate. Front ends of the electrically conductive pads do not reach a front edge of the flexible substrate and are separated from the front edge of the flexible substrate by a distance.

Preferably, the front end of the electrically conductive pad has an arc surface.

Preferably, the front end of the electrically conductive pad has a trapezoid surface.

Preferably, the front end of the electrically conductive pad is separated from the front edge of the flexible substrate by a distance ranging from 0.1~0.5 mm.

Preferably, the electrically conductive pads are made of carbon ink or metal material.

Preferably, the flexible circuit board is a flexible printed circuit board, a flexible flat cable, or a thin film switch.

DETAILED DESCRIPTION OF THE PREFERRED EMBODIMENTS

Although the present invention will be described in considerable detail with reference to certain preferred embodiments thereof, however prior to this description, it is should be understood that those skilled in the art can easily make changes to the present invention described herein and the same performance as the present invention is obtained. Therefore, it is to be understood that the following description is a general disclosure to those skilled in the art and is not restrictive of the present invention.

Figure 1A:
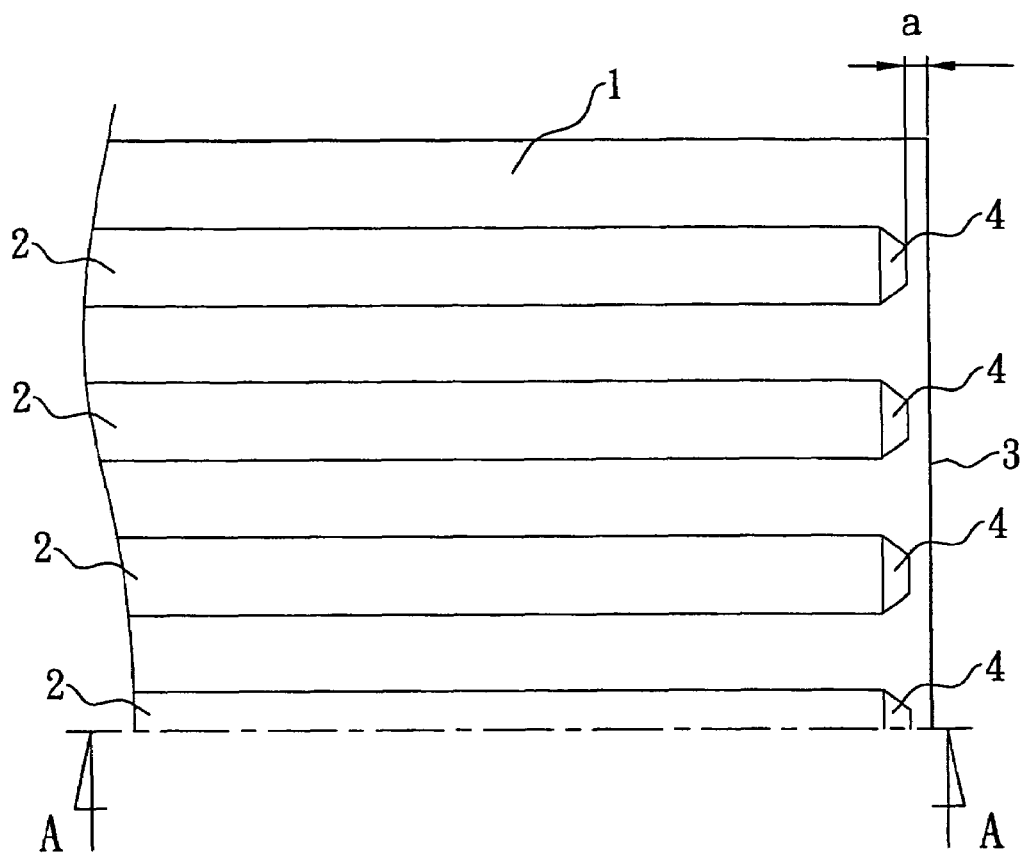
FIG. 1A is a top view of the flexible circuit board of the present invention.
Figure 1B:
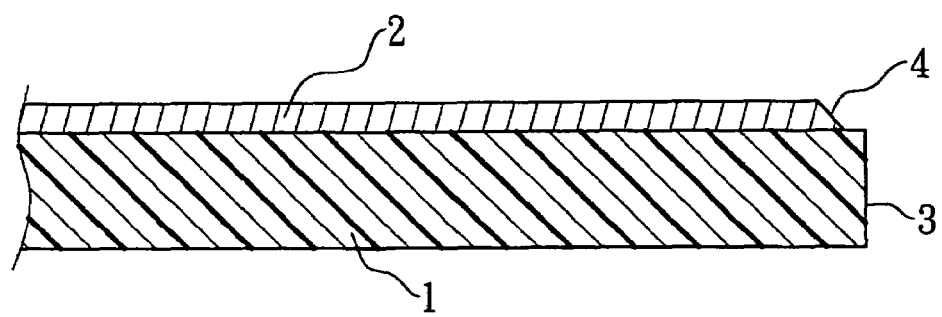
FIG. 1B is a sectional view taken along the A-A line of FIG. 1A.

Referring to FIG. 1A and FIG. 1B, a top view of the flexible circuit board according to a preferred embodiment of the present invention and a sectional view taken along the A-A line of FIG. 1A are respectively shown. The present flexible circuit board comprises a flexible substrate 1 having an upper surface and a lower surface and a plurality of electrically conductive pads 2 overlaid on the upper surface of the flexible substrate 1. Front ends 4 of the electrically conductive pads 2 do not reach a front edge 3 of the flexible substrate 1.

In the preferred embodiment of the present flexible circuit board, the plurality of electrically conductive pads 2 are parallel aligned and overlaid on the upper surface of the flexible substrate 1. The front end 4 of the electrically conductive pad 2 has a trapezoid surface and is separated from the front edge 3 of the flexible substrate 1 by a distance indicated by a double arrow "a" in FIG. 1A. Preferably, the distance ranges from 0.1~0.5 mm.

Figure 2A:
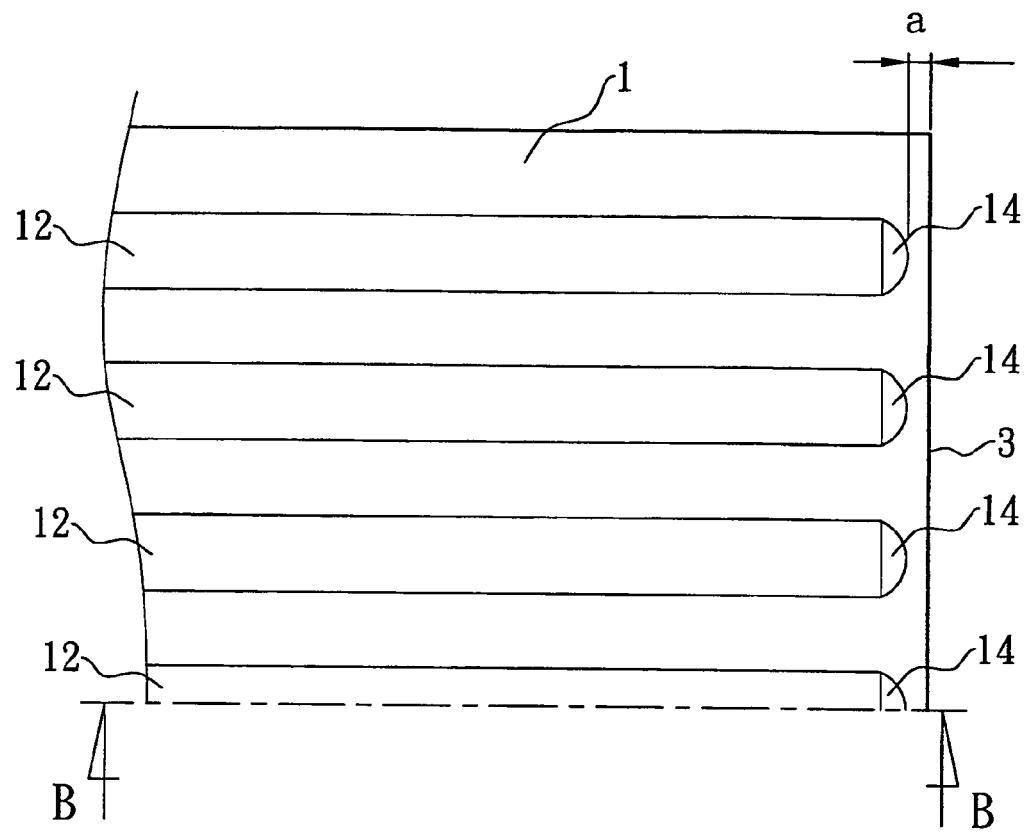
FIG. 2A is a top view of another embodiment of the flexible circuit board of the present invention.
Figure 2B:
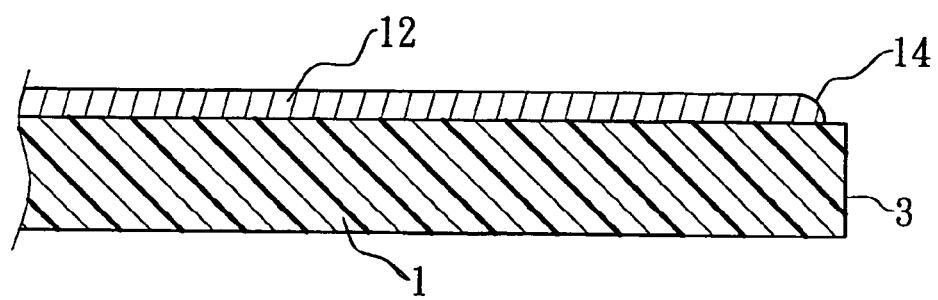
FIG. 2B is a sectional view taken along the B-B line of FIG. 2A.

Referring to FIG. 2A and FIG. 2B, a top view of another embodiment of the flexible circuit board of the present invention and a sectional view taken along the B-B line of FIG. 2A are respectively shown. In this preferred embodiment, the present flexible circuit board comprises a flexible substrate 1 having an upper surface and a lower surface and a plurality of electrically conductive pads 12 overlaid on the upper surface of the flexible substrate 1. Front ends 14 of the electrically conductive pads 12 do not reach a front edge 3 of the flexible substrate 1.

The plurality of electrically conductive pads 12 are parallel aligned and overlaid on the upper surface of the flexible substrate 1. The front end 14 of the electrically conductive pad 12 has an arc surface and is separated from the front edge 3 of the flexible substrate 1 by a distance indicated by a double arrow "a" in FIG. 2A. Preferably, the distance ranges from 0.1~0.5 mm.

Figure 3:
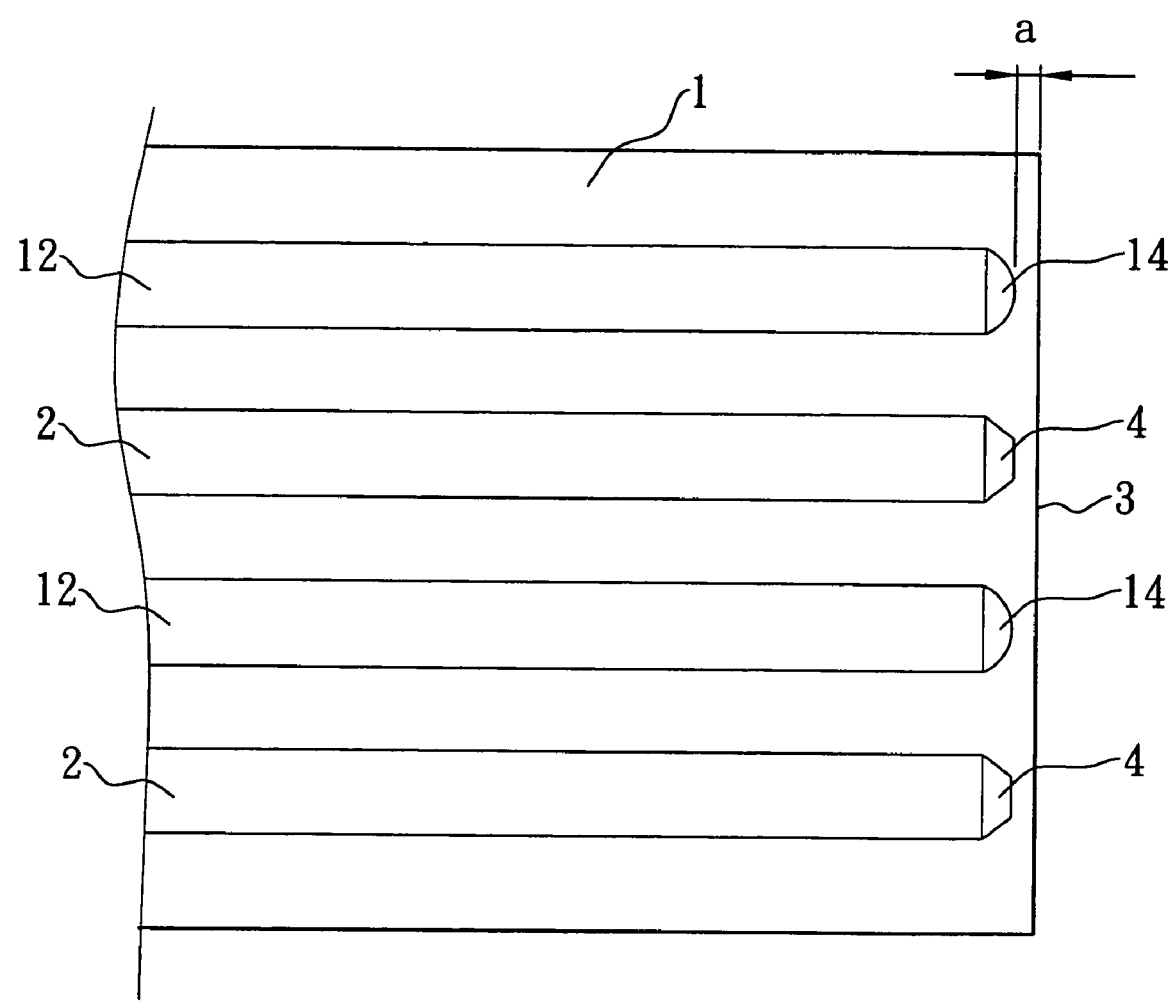
FIG. 3 is a top view of the present flexible circuit board showing various embodiments of the electrically conductive pads overlaid on the upper surface of the flexible substrate.

Referring to FIG. 3, a top view of the present flexible circuit board with different embodiments of the electrically conductive pads overlaid on the upper surface of the flexible substrate is shown. In this preferred embodiment, the present flexible circuit board comprises a flexible substrate 1 having an upper surface and a lower surface and a plurality of electrically conductive pads 2, 12 overlaid on the upper surface of the flexible substrate 1. Front ends 4 of the electrically conductive pads 2 and front ends 14 of the electrically conductive pads 12 do not reach a front edge 3 of the flexible substrate 1.

The plurality of electrically conductive pads 2, 12 are parallel aligned and overlaid on the upper surface of the flexible substrate 1, and the front end 4 of the electrically conductive pad 2 and the front end 14 of the electrically conductive pad 12 are respectively separated from the front edge 3 of the flexible substrate 1 by a distance indicated by a double arrow "a" in FIG. 3. Preferably, the distance ranges from 0.1~0.5 mm.

Figure 4:
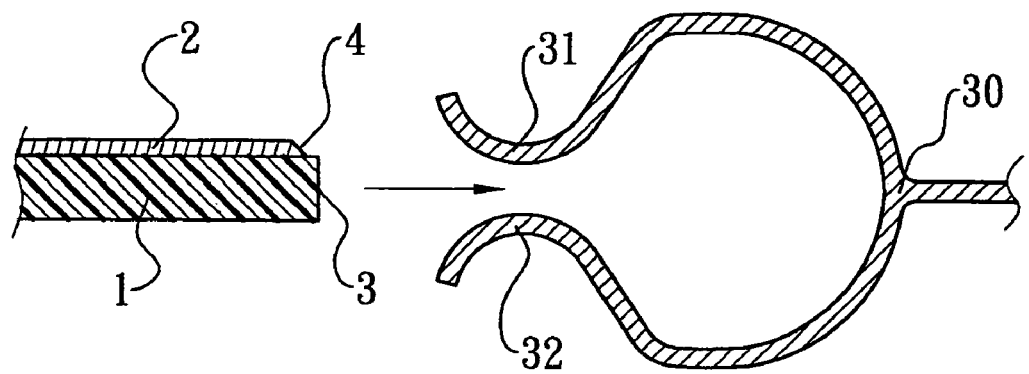
FIG. 4 schematically illustrates the present flexible circuit board being inserted into a connector terminal.
Figure 5:
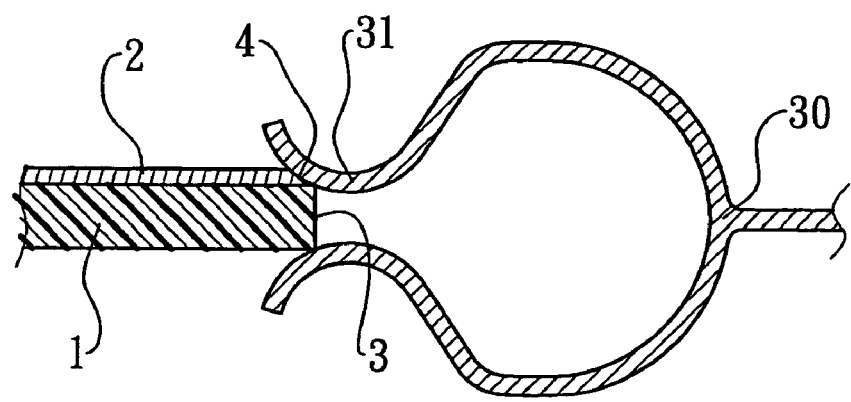
FIG. 5 schematically illustrates the present flexible circuit board inserted into a connector terminal.
Figure 6:
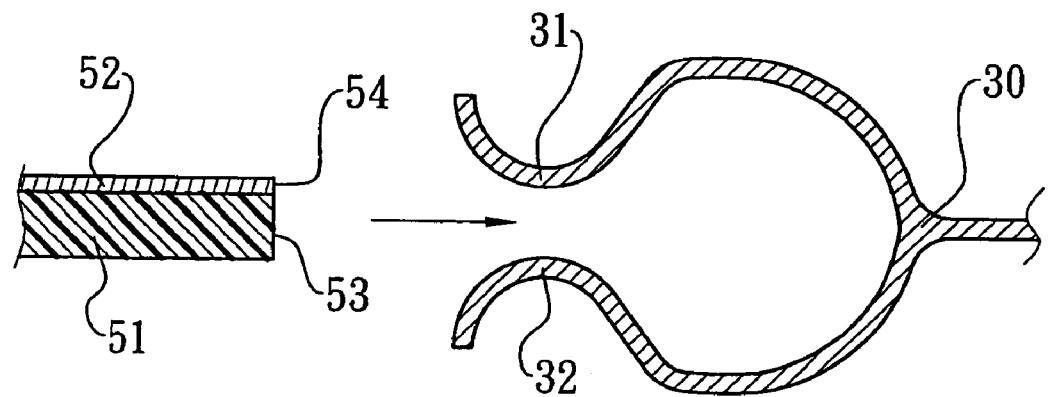
FIG. 6 schematically illustrates a conventional flexible circuit board being inserted into a connector terminal.
Figure 7:
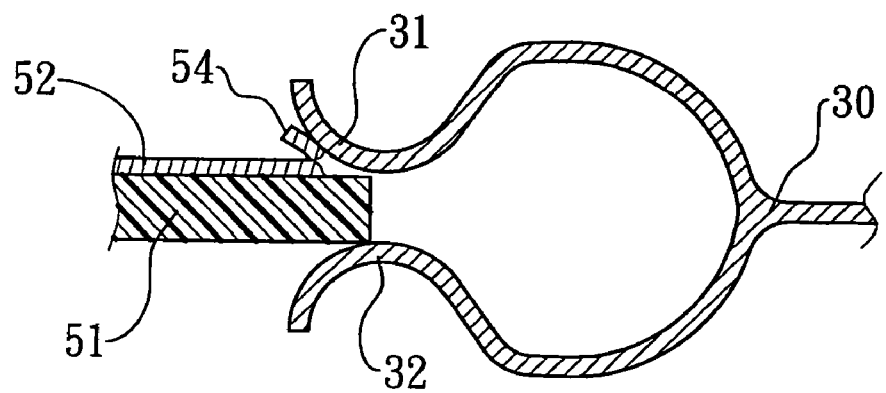
FIG. 7 schematically illustrates a conventional flexible circuit board inserted into a connector terminal.

Referring to FIG. 4 and FIG. 5, both schematically illustrates a flexible circuit board being inserted into a connector terminal and a flexible circuit board inserted into a connector terminal. When an operator pushes the flexible circuit board 1 into a connector terminal 30 for assembly, an upper elastic flat piece 31 and a lower elastic flat piece 32 of the connector terminal 30 will be opened by the flexible circuit board 1 and electrically connect the flexible circuit board 1. During the connecting process of the upper elastic flat piece 31, the lower elastic flat piece 32 and the flexible circuit board 1, a bent inclined surface of the upper elastic flat piece 31 may be smoothly positioned on the electrically conductive pad 2 by the guiding of the front end 4 of the electrically conductive pad 2. Additionally, the front end 4 of the electrically conductive pad 2 is separated from the front edge 3 of the flexible substrate 1 by a distance (please refer to FIG. 1A) which preferably ranges from 0.1~0.5 mm and actually provides a function of buffer. As such, the upper elastic flat piece 31 will first touch the upper surface of the electrically conductive pad 2 and then be slowly positioned on the electrically conductive pad 2 by the guiding of the trapezoid surface of the front end 4 of the electrically conductive pad 2.

The advantages of the present invention are that the front end of the electrically conductive pad is separated from the front edge of the flexible substrate by a distance which provides the function of buffer for the connector terminal; additionally, the trapezoid or arc surfaces of the front end of the electrically conductive pad provides the function of guiding for the connector terminal. The connector terminal may not only be smoothly positioned on the electrically conductive pads, but also the scratching (or abrasion) of the electrically conductive solder pads is reduced.

Although the preferred embodiments of the present invention have been described in considerable detail, all kinds of alterations and changes can be made within the spirit and scope of the appended claims and the present invention is also not limited to the implementations of the preferred embodiments contained herein, such as the flexible circuit board may be a FPC (Flexible Printed Circuit), a FFC (Flexible Flat Cable), or a thin film switch.

What is claimed is:

1. A flexible circuit board, comprising:
    a flexible substrate having an upper surface and a lower surface; and
    a plurality of electrically conductive pads overlaid on said upper surface of said flexible substrate, each of said electrically conductive pads having a trapezoid surface on a front end thereof;
    wherein said front ends of said electrically conductive pads do not reach a front edge of said flexible substrate and are separated from said front edge of said flexible substrate by a distance.

2. The flexible circuit board as claimed in claim 1, wherein said front end of said electrically conductive pad is separated from said front edge of said flexible substrate by a distance ranging from 0.1~0.5 mm.

3. The flexible circuit board as claimed in claim 1, wherein said electrically conductive pads are made of carbon ink or metal materials.

4. The flexible circuit board as claimed in claim 1, wherein said flexible circuit board is a flexible printed circuit board, a flexible flat cable, or a thin film switch.

5. A flexible circuit board comprising a flexible substrate and a plurality of electrically conductive pads overlaid on an upper surface of said flexible substrate, said flexible circuit board suitable for inserting into a connector terminal, and each of front ends of said electrically conductive pads having a trapezoid surface, which is characterized in that:
    said front ends of said electrically conductive pads on said upper surface of said flexible circuit board do not reach a front edge of said flexible substrate and are separated from said front edge of said flexible substrate by a distance.

6. The flexible circuit board as claimed in claim 5, wherein said front end of said electrically conductive pad is separated from said front edge of said flexible substrate by a distance ranging from 0.1~0.5 mm.

7. The flexible circuit board as claimed in claim 5, wherein said electrically conductive pads are made of carbon ink or metal materials.

8. The flexible circuit board as claimed in claim 5, wherein said flexible circuit board is a flexible printed circuit board, a flexible flat cable, or a thin film switch.

* * * * *